US012216163B2

(12) United States Patent
De La Puente

(10) Patent No.: US 12,216,163 B2
(45) Date of Patent: Feb. 4, 2025

(54) SYSTEMS AND METHODS OF TESTING DEVICES USING CXL FOR INCREASED PARALLELISM

(71) Applicant: ADVANTEST CORPORATION, Tokyo (JP)

(72) Inventor: Edmundo De La Puente, San Jose, CA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 18/105,792

(22) Filed: Feb. 3, 2023

(65) Prior Publication Data
US 2024/0094293 A1 Mar. 21, 2024

Related U.S. Application Data

(60) Provisional application No. 63/439,489, filed on Jan. 17, 2023, provisional application No. 63/407,058, filed on Sep. 15, 2022.

(51) Int. Cl.
G01R 31/319 (2006.01)

(52) U.S. Cl.
CPC . *G01R 31/31907* (2013.01); *G01R 31/31926* (2013.01)

(58) Field of Classification Search
None
See application file for complete search history.

(56) References Cited

FOREIGN PATENT DOCUMENTS

CN 101587465 A * 11/2009

* cited by examiner

Primary Examiner — Guerrier Merant

(57) ABSTRACT

Embodiments of the present invention can selectively enable 16 lane (×16) or 8 lane (×8) device testing using multiplexor circuitry disposed between a CXL1.1 CPU and the DUTs during testing. In this way, parallelism and testing efficiency are significantly improved compared to existing approaches that can only test devices using 8 lanes of the CXL 1.1 CPU.

10 Claims, 4 Drawing Sheets

SYSTEMS AND METHODS OF TESTING DEVICES USING CXL FOR INCREASED PARALLELISM

CROSS REFERENCE TO RELATED APPLICATION

This patent application claims priority and benefit of U.S. Provisional Patent Application No. 63/407,058, entitled "Improvements on CXL Bus Protocol to Increase Parallelism (AKA CXL 1.1 ×8 Support)," filed on Sep. 15, 2022, and U.S. Provisional Patent Application No. 63/439,489, entitled "Systems and Methods of Testing Devices Using CXL for Increased Parallelism" filed on Jan. 17, 2023, the entire content of which are herein incorporated by reference for all purposes.

FIELD

Embodiments of the present invention generally relate to the field of device testing. More specifically, embodiments of the present invention relate to methods and systems for testing a device under test (DUT) using Compute Express Link (CXL).

BACKGROUND

A device or equipment under test is typically tested to determine the performance and consistency of the device before the device is sold. For example, a DUT can be tested using a large variety of test cases, and the result of the test cases can be compared to an expected output result. When the result of a test case does not match a satisfactory value or range of values, the device can be considered a failed device or outlier, and the device can be binned based on performance, etc.

A DUT is usually tested by automatic or automated test equipment (ATE), which may be used to conduct complex testing using software and automation to improve the efficiency of testing. The DUT may be any type of semiconductor device, wafer, or component that is intended to be integrated into a final product, such as a computer, network interface, or solid-state drive (SSD). By removing defective or unsatisfactory chips at manufacture using ATE, the quality of the yield can be significantly improved.

Compute Express Link is an open standard for high-speed CPU-to-device and CPU-to-memory connections, designed for high performance data center computers. CXL is built on the PCI Express physical and electrical interface and includes PCIe-based block input/output protocol and new cache-coherent protocols for accessing system memory and device memory. Recently, improvements have been made to the CXL bus protocol in CXL 2.0 that enables testing devices of different widths using 16 bus lanes (PCIe bus lanes) in parallel. However, existing processors that only support up to CXL 1.1 are unable to take advantage of this improvement in multi-port testing using existing approaches, and are typically limited to testing devices using 16 lanes in parallel, which limits testing parallelism and efficiency.

SUMMARY

Accordingly, what is needed is an approach to device testing using CXL 1.1 that can utilize all 16 lanes available under the improved CXL bus protocol for parallel testing. Embodiments of the present invention can selectively enable configurations which allows 16 lane testing (×16) of one DUTs in parallel, or 8 lane testing (×8) of two DUTs in parallel using extend board located multiplexors disposed between the CPU and the DUTs during testing. In this way, parallelism and testing efficiency are significantly improved compared to existing approaches that can only test devices using 16 lanes of the CXL 1.1 CPU.

According to one embodiment, a circuit for bifurcating buses of a processor is disclosed. The circuit includes a plurality of input ports for coupling to four n-bit buses from the processor where each of the four buses includes n bits and respectively includes a lower half and a higher half, a plurality of output ports for providing four buses where each of the four buses from the plurality of output ports include n/2 bits, and multiplexing circuitry coupled to the plurality of input ports and coupled to the plurality of output ports, the multiplexing circuitry responsive to a common select line for selectively implementing one of two configurations, including a first configuration which couples the plurality of output ports to only lower halves of the four buses from the processor, and a second configuration which couples the plurality of output ports to lower and higher halves of at least two of the four buses from the processor.

According to some embodiments, the multiplexing circuitry includes a plurality of high-speed multiplexers, each high-speed multiplexer coupled to the common select line.

According to some embodiments, the plurality of high-speed multiplexers include two multiplexers.

According to some embodiments, n is 16.

According to some embodiments, the first configuration is operable to couple the processor to four devices under test (DUT), each of the four DUTs including an n/2 bit wide bus. In this example, n=16.

According to some embodiments, the second configuration is operable to couple the processor to two DUTs, each of the two DUTs including an n bit wide bus. In this example, n=16.

According to some embodiments, the first and the second configurations are operable to be dynamically configured based on a value of the select line.

According to a different embodiment, a tester circuit for testing devices under test (DUTs) is disclosed. The tester circuit includes the processor having four n-bit buses, a plurality of input ports coupled the four n-bit buses of the processor where each of the four n-bit buses includes a lower half and a higher half, a plurality of output ports for providing four n/2-bit buses, and high-speed multiplexing circuitry coupled to the plurality of input ports and coupled to the plurality of output ports, the high-speed multiplexing circuitry responsive to a common select line for selectively implementing one of two configurations including a first configuration which couples the plurality of output ports to only lower halves of the four n-bit buses from the processor, and a second configuration which couples the plurality of output ports to lower and higher halves of at least two of the four n-bit buses from the processor.

According to some embodiments, the high-speed multiplexing circuitry includes a plurality of high-speed multiplexers each high-speed multiplexer coupled to the common select line.

According to some embodiments, n is 16.

According to some embodiments, the first configuration is operable to couple the processor to four DUTs for testing thereof, each of the four DUTs including an n/2 bit wide bus.

According to some embodiments, the second configuration is operable to couple the processor to two devices DUTs for testing thereof, each of the two DUTs including an n bit wide bus.

According to some embodiments, the first and the second configurations are operable to be dynamically configured.

According to another embodiment, a method of bifurcating buses of a processor for testing is disclosed. The method includes a processor generating signals over at least four n-bit buses, in a first mode of operation, multiplexer circuitry coupled to the at least four n-bit buses of the processor, and disposed external to the processor, generating signals over four n/2-bit output buses. In the first mode of operation, the processor simultaneously tests four devices under test (DUTs) with the four n/2-bit output buses. In the second mode of operation, the multiplexer circuitry generates signals over two n-bit output buses, and the processor simultaneously tests two DUTs with the two n-bit output buses. The method further includes switching between the first and second mode of operation by switching a value of a select line coupled to the multiplexing circuitry.

According to some embodiments, the multiplexer circuitry includes high-speed multiplexers commonly coupled to the select line.

According to some embodiments, the high-speed multiplexers include two multiplexers.

According to some embodiments, n=16.

According to some embodiments, the first mode of operation supplies only lower halves of the 4 n-bit buses from the processor over the four n/2-bit output buses.

According to some embodiments, the second mode of operation supplies two of the 4 n-bit buses from the processor over the two n-bit output buses.

According to some embodiments, the second mode of operation supplies two of the 4 n-bit buses from the processor over the two n-bit output buses.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
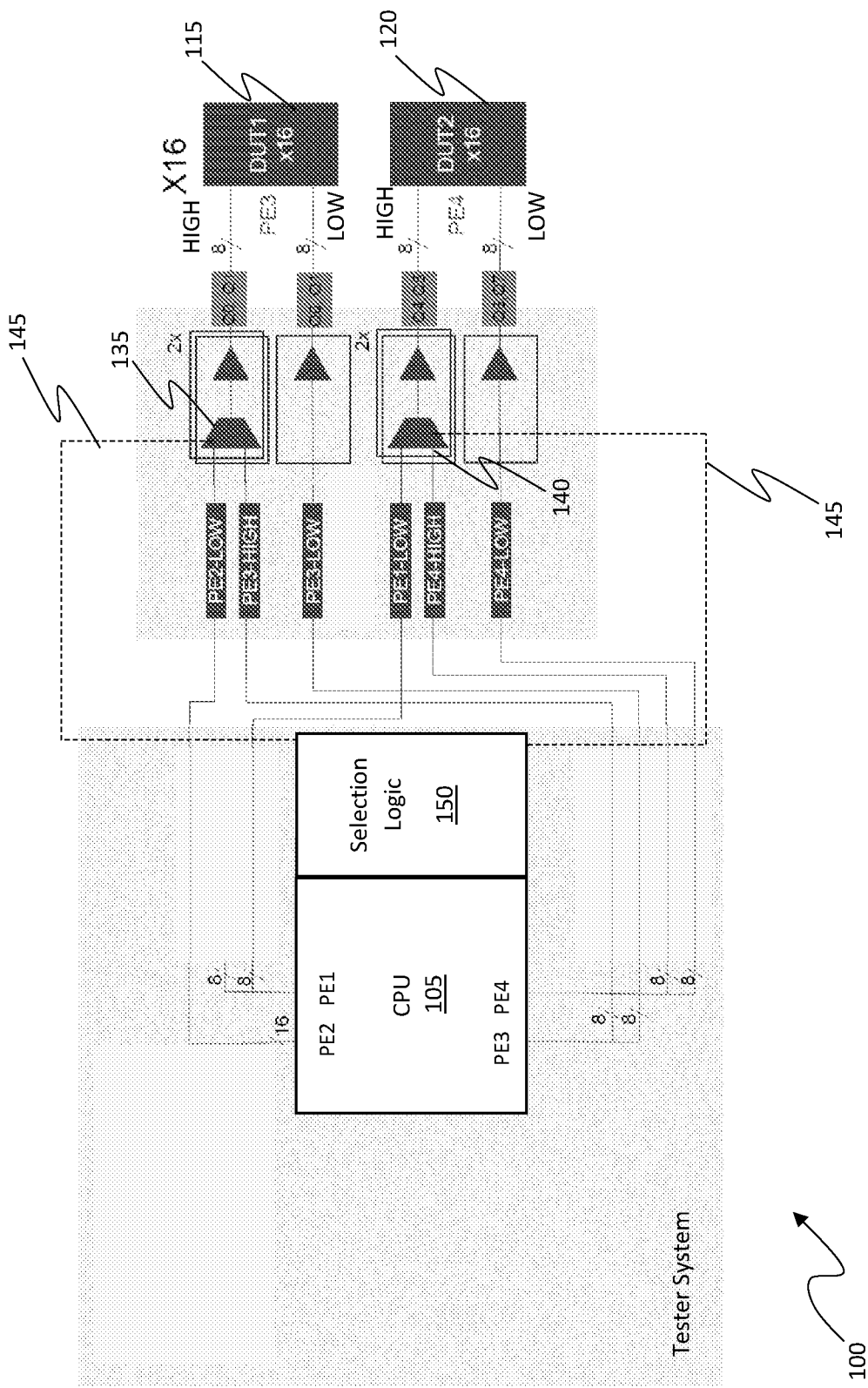
FIG. 1 is a block diagram of a tester system and circuitry for selectively enabling configurations that support 8× or 16× device testing using multiplexor circuitry in a first configuration according to embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein (e.g., FIG. 3) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, parameters, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," "labeling," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, algorithms, programs, objects, components, data structures, etc. that perform particular tasks or implement particular abstract data types. Typically the functionality of the program modules may be combined or distributed as desired in various embodiments.

Parallel Testing of DUTs Using a CXL 1.1 Processor

Embodiments of the present invention can selectively enable 16 lane (×16) or 8 lane (×8) device testing using multiplexor circuitry disposed between a CXL1.1 CPU and the DUTs during testing. In this way, parallelism and testing efficiency are significantly improved compared to existing approaches that can only test devices using 8 lanes of the CXL 1.1 CPU. In one embodiment, the multiplexors are high-speed multiplexors.

FIG. 1 depicts an exemplary tester system 100 coupled to multiplexors 135 and 140 for testing DUTs 115 and 120 in parallel using 16 lanes for each DUT. Tester system 100 includes a CXL 1.1 CPU 105 capable of communicating with peripheral devices using an enhanced CXL protocol. In the example of FIG. 1, CPU 105 uses 16-bit output ports PE1, PE2, PE3, and PE4 for testing devices. The output ports PE1, PE2, PE3, and PE4 each provide 16 PCIe lanes for testing a DUT by sending data or commands to be executed by the DUT. Using 16 lanes significantly improves parallelism and efficiency of testing compared to using 8 lanes in existing approaches. CPU 105 can also test four DUTs in parallel using 8 lanes for each DUT to test more devices at the same time (see FIG. 2). The DUTs are typically disposed in sockets of a device interface board installed on a site module. Each DUT can be tested independently by a separate test program executed by CPU 105.

The outputs PE1, PE2, PE3, and PE4 of CPUI 105 are transmitted to multiplexor circuitry 130, which includes multiplexors 135 and 140 coupled to a common select line 145. Each output port can be bifurcated into higher order bits (HIGH) and lower order bits (LOW). Typically, the output ports are 16-bits which are bifurcated into two 8-bit lanes. Importantly, for ×16 testing, all inputs that a device receives must originate from the same CPU port.

In the example of FIG. 1, multiplexor 135 outputs PE3-HIGH to DUT 115, and multiplexor 140 outputs PE4-HIGH to DUT 120 in a ×16 operating mode. Output port PE3 is used to test DUT 115, where PE3-HIGH transmits the 8 higher order bits, and PE3-LOW transmits the 8 lower order bits. Similarly, output port PE4 is used to test DUT 120, where PE4-HIGH transmits the 8 higher order bits, and PE4-LOW transmits the 8 lower order bits. During ×16 testing, output ports PE1 and PE2 are not typically used. As discussed in more detail below, for testing four DUTs in parallel using ×8 (FIG. 2), multiplexor 135 outputs PE2-LOW to one DUT, and outputs PE3-LOW to a second DUT. Similarly, multiplexor 140 outputs PE1-LOW to a third DUT, and outputs PE4-LOW to another DUT.

Multiplexor circuitry 130 can also include a current buffer at each output to prevent signals transmitted through multiplexor circuitry 130 form being affected by differences in the amount of current drawn by the output loads.

Multiplexors 135 and 140 are operated using common select line 145 for selecting the output based on a high or low value. Selection logic 150 generates signals for toggling between inputs of the multiplexors 135 and 104. Selection logic 150 may executed by a test program executing on CPU 105 or by a separate component (e.g., a switch or module), or it may originate from the processor.

According to some embodiments, if select line 145 is low (e.g., 0), the 8 lower order bits are selected for output (e.g., PE2-LOW and PE1-LOW), and each of the four DUTs receives input from eight lanes; if select line 145 is high (e.g., 1), the 8 higher order bits are selected for output (e.g., PE3-HIGH and PE4-HIGH) so that each of the two DUT receives input from 16 lanes when combined with PE3-LOW and PE4-LOW.

Figure 2:
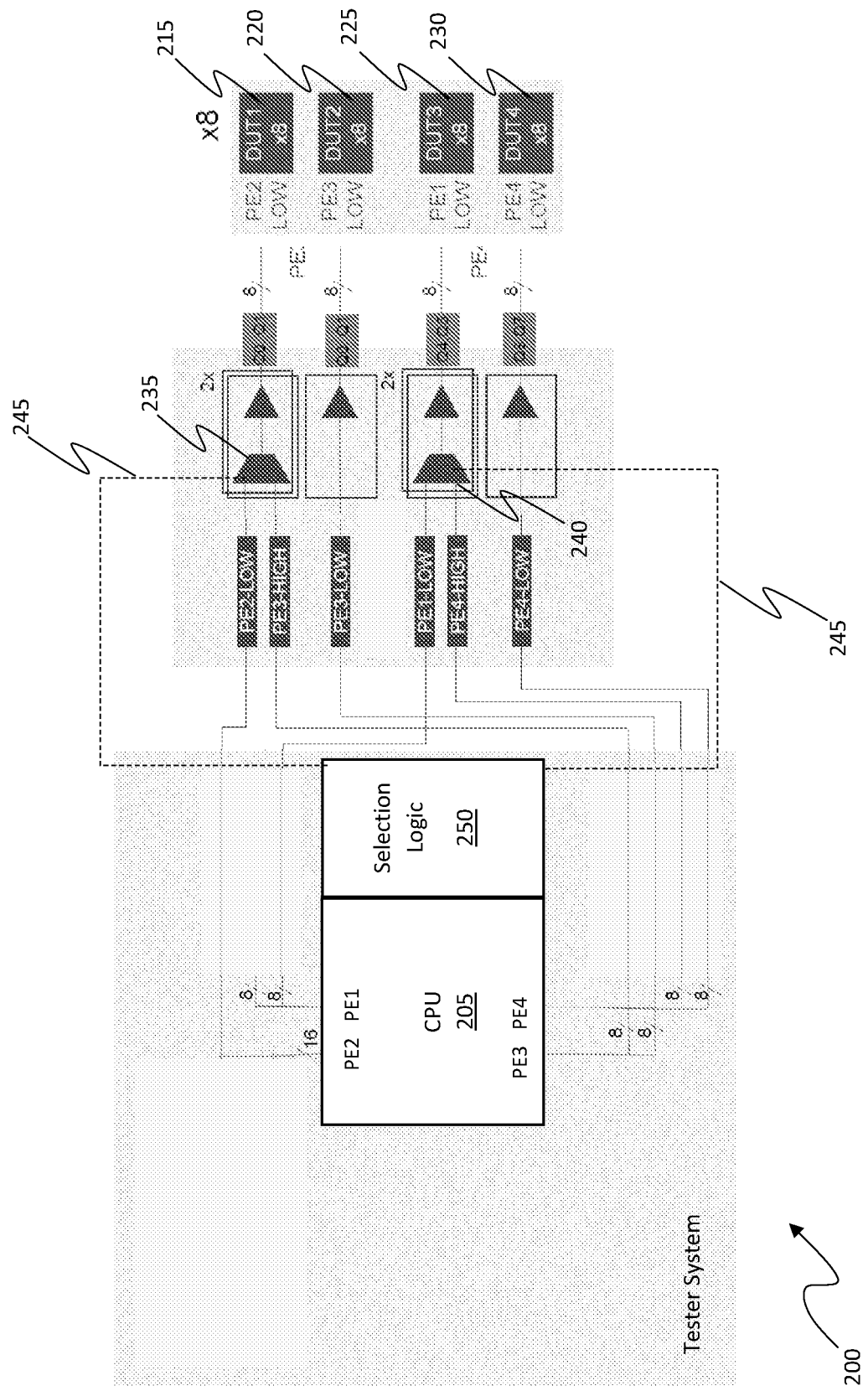
FIG. 2 is a block diagram of a tester system and circuitry for selectively enabling configurations that support 8× or 16× device testing using multiplexor circuitry in a second configuration according to embodiments of the present invention.

FIG. 2 depicts an exemplary tester system 200 coupled to multiplexors 235 and 240 for testing DUTs 215, 220, 225, and 230 in parallel using 8 lanes for each DUT. Tester system 200 includes a CXL 1.1 CPU 205 capable of communicating with peripheral devices using an enhanced CXL protocol. In the example of FIG. 2, CPU 205 uses output ports PE1, PE2, PE3, and PE4 for testing devices. The output ports PE1, PE2, PE3, and PE4 each provide 16 PCIe lanes for testing a DUT by sending data or commands to be executed by the DUT. CPU 205 can also test four DUTs in parallel using 8 lanes for each DUT to test more devices at the same time. The DUTs are typically disposed in sockets of a device interface board installed on a site module. Each DUT can be tested independently by a separate test program executed by CPU 205.

According to some embodiments, when two DUTs are available for ×16 testing, and 4 DUTs are available for ×8 testing, all 6 DUTs can be coupled to the outputs of multiplexor circuitry 235, and the output can be provided to the DUTs according to the value of select line 245 generated by selection logic 250. In this way, tester system 200 can toggle between ×16 and ×8 operating modes without downtime.

In the example of FIG. 2, for testing four DUTs in parallel, multiplexors 235 and 240 receive a low value over select line 245, and the bits PE2-LOW and PE1-LOW are passed as output. In this way, DUT 215 receives input from PE2-LOW, DUT 220 receives input from PE3-LOW, DUT 220 receives input from PE1-LOW, and DUT 225 receives input from PE4-LOW, each using 8 lanes. In this way, each of the four DUT can be tested in parallel for improved speed and efficiency.

Figure 3:
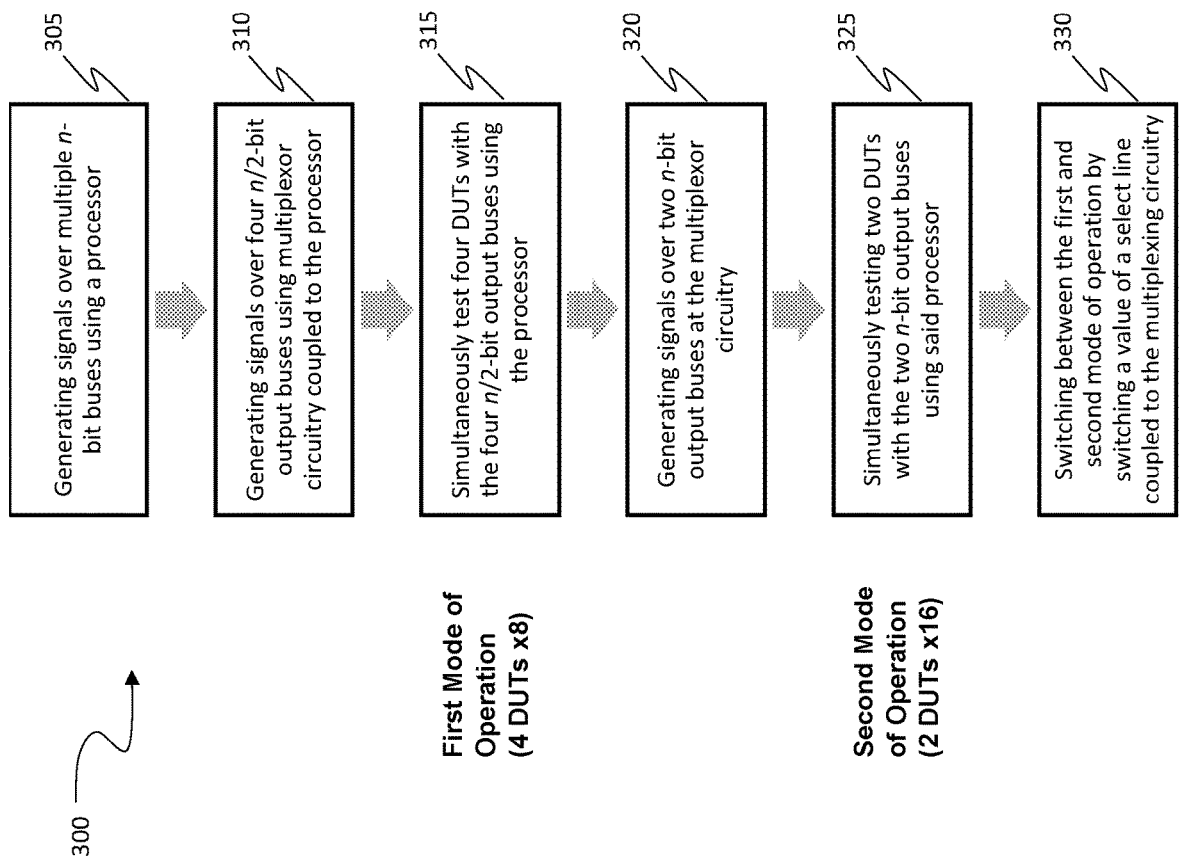
FIG. 3 is a flow chart depicting an exemplary sequence of computer implemented steps of a computer-controlled process for automatically testing multiple DUTs in parallel using multiplexor circuitry to selectively enable 8× or 16× device testing.

FIG. 3 is a flow chart depicting an exemplary automatic parallel DUT testing process 300 executed by a CXL 1.1 processor for testing multiple DUTs in a ×8 or ×16 configuration using an enhanced CXL bus protocol according to embodiments of the present invention.

At step 305, signals are generated over multiple n-bit buses using the (CXL 1.1) processor.

At step 310, signals are generated over four n/2-bit output buses using multiplexor circuitry coupled to the processor.

At step 315, four DUTs are tested with the four n/2-bit output buses simultaneously using the processor in a first operating mode (×8).

At step 320, signals are generated over two n-bit output buses at the multiplexor circuitry.

At step 325, two DUTs are tested with the two n-bit output buses simultaneously using said processor.

At step 330, a value of a select line coupled to the multiplexing circuitry is changed to switch between the first mode of operation and the second mode of operation.

Exemplary Test System

Figure 4:
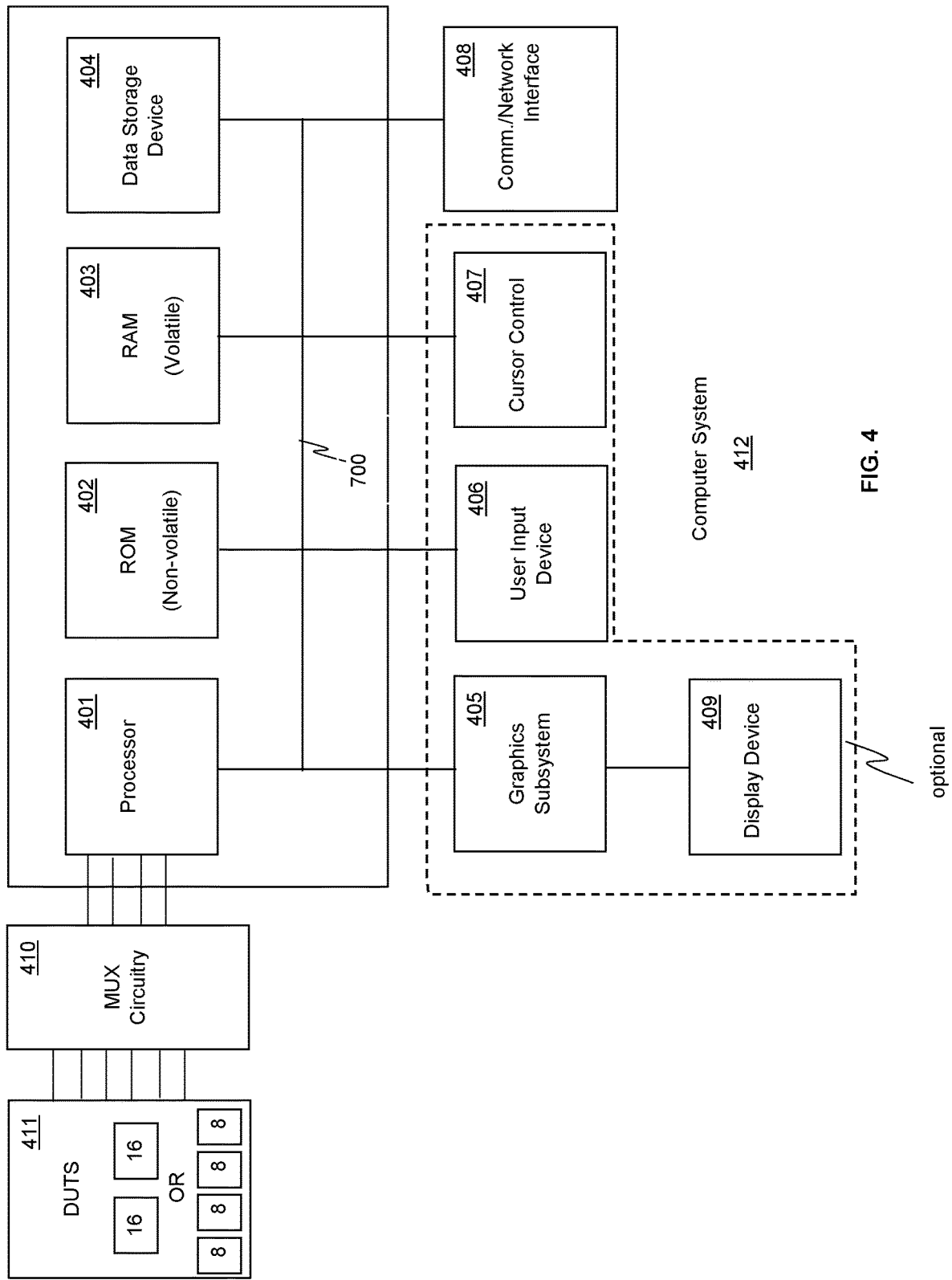
FIG. 4 depicts an exemplary tester computer system platform (e.g., tester system) upon which embodiments of the present invention may be implemented.

Embodiments of the present invention are drawn to electronic systems having a CLX 1.1 processor and enable the processor to test multiple DUTs in parallel using an enhanced CXL bus protocol and multiplexor circuitry to selectively enable ×8 or ×16 device testing for improved parallelism and efficiency compared to existing approaches. In the example of FIG. 4, the exemplary computer system 412 may be a test system that includes a central processing unit (CPU) 401 for running software applications and an operating system. CPU 401 can test multiple DUTs 411 in parallel by executing a test program that transmits commands and/or data to DUTs 411 that may be disposed in sockets of a device interface board installed on a site module, for example. According to some embodiments, the CPU can selectively enable ×8 and ×16 testing of the DUTs 411 by configuring multiplexor circuitry 410 using a select line. The outputs ports of CPU 401 can be coupled to the multiplexor circuitry 410, and the output of the multiplexor circuitry 410 is passed to the DUTs 411 (or a device interface board, site module, etc.), to test the functionality and performance of the DUTs 411, for example. The 4 output ports of CPU 401 connected to output circuitry 410 typically include 16 lanes each (64 lanes total). Moreover, computer system 412 can include 2 CPUs for a total of 8 output ports and 128 lanes, according to some embodiments.

Random access memory 402 and read-only memory 403 store applications and data for use by the CPU 401. Data storage device 404 provides non-volatile storage for applications and data and may include fixed disk drives, removable disk drives, flash memory devices, and CD-ROM, DVD-ROM or other optical storage devices. The data storage device 404 or the memory 402/403 can store historic and real-time testing data (e.g., test results, limits, computations, etc.). The optional user inputs 406 and 407 comprise devices that communicate inputs from one or more users to the computer system 412 (e.g., mice, joysticks, cameras, touch screens, keyboards, and/or microphones). A communication or network interface 408 allows the computer system 412 to communicate with other computer systems, networks, or devices via an electronic communications network, including wired and/or wireless communication and including an Intranet or the Internet.

The optional display device 409 may be any device capable of displaying visual information, e.g., the final scan report, in response to a signal from the computer system 412 and may include a flat panel touch sensitive display, for example. The components of the computer system 412, including the CPU 401, memory 402/403, data storage 404, user input devices 406, and graphics subsystem 405 may be coupled via one or more data buses 400.

Embodiments of the present invention are thus described. While the present invention has been described in particular embodiments, it should be appreciated that the present invention should not be construed as limited by such embodiments, but rather construed according to the following claims.

What is claimed is:

1. A circuit for bifurcating bus lanes of a processor, the circuit comprising:
   a plurality of input ports for coupling to four 16-bit buses from said processor wherein each of said four 16-bit buses comprises a lower set of bits and a higher set of bits;
   a plurality of output ports for providing four 8-bit buses;
   multiplexing circuitry coupled to said plurality of input ports and coupled to said plurality of output ports, said multiplexing circuitry responsive to a common select line for selectively implementing one of two configurations comprising:
   a first configuration which couples said plurality of output ports to only lower halves sets of bits of said four 16-bit buses from said processor; and
   a second configuration which couples said plurality of output ports to lower and higher halves sets of bits of at least two of said four 16-bit buses from said processor, wherein two of the four 8-bit buses are operable to be coupled to a first device under test (DUT) for testing said first DUT, and wherein the other two of the four 8-bit buses are operable to be coupled to a second DUT for testing said second DUT in the second configuration.

2. The circuit as described in claim 1, wherein said multiplexing circuitry comprises a plurality of high-speed multiplexers, each high-speed multiplexer coupled to said common select line.

3. The circuit as described in claim 2, wherein said plurality of high-speed multiplexers comprise two multiplexers.

4. The circuit as described in claim 1, wherein said first and said second configurations are operable to be dynamically configured based on a value of said common select line.

5. A tester circuit for testing devices under test (DUTs), said tester circuit comprising:
   a processor having four 16-bit buses;
   a plurality of input ports coupled said four 16-bit buses of said processor wherein each of said four 16-bit buses comprises a lower set of bits and a higher set of bits;
   a plurality of output ports for providing four 8-bit buses; and
   high-speed multiplexing circuitry coupled to said plurality of input ports and coupled to said plurality of output ports, said high-speed multiplexing circuitry responsive to a common select line for selectively implementing one of two configurations comprising:
   a first configuration which couples said plurality of output ports to only lower halves of said four 16-bit buses from said processor, wherein each of the four 8-bit buses are operable to be coupled to four respective devices under test (DUTs) for testing said DUTs in the first configuration; and
   a second configuration which couples said plurality of output ports to lower and higher halves of at least two of said four 16-bit buses from said processor.

6. The tester circuit as described in claim 5, wherein said high-speed multiplexing circuitry comprises a plurality of high-speed multiplexers each high-speed multiplexer coupled to said common select line.

7. The circuit as described in claim 5, wherein said first and said second configurations are operable to be dynamically configured.

8. A method of bifurcating buses of a processor for testing, said method comprising:
   a processor generating signals over at least four 16-bit buses;
   in a first mode of operation, multiplexer circuitry coupled to said at least four 16-bit buses of said processor, and disposed external to said processor, generating signals over four 8-bit output buses;
   in said first mode of operation, using said processor to simultaneously test four devices under test (DUTs) with said four 8-bit output buses;
   in a second mode of operation, said multiplexer circuitry generating signals over two 16-bit output buses;
   in said second mode of operation, using said processor to simultaneously test two DUTs with said two 16-bit output buses; and
   switching between said first mode and said second mode of operation by switching a value of a select line coupled to said multiplexing circuitry.

9. A method as described in claim 8, wherein said multiplexer circuitry comprises high-speed multiplexers commonly coupled to said select line.

10. The method as described in claim 9, wherein said high-speed multiplexers comprise two multiplexers.

* * * * *